US009541830B2

(12) United States Patent
Ober et al.

(10) Patent No.: US 9,541,830 B2
(45) Date of Patent: Jan. 10, 2017

(54) BLOCK COPOLYMERS AND LITHOGRAPHIC PATTERNING USING SAME

(75) Inventors: Christopher K. Ober, Ithaca, NY (US); Rina Maeda, Madison, WI (US); Nam-ho You, Jeollabukdo (KR); Teruaki Hayakawa, Tokyo (JP)

(73) Assignee: Cornell University, Ithaca, NY (US)

( * ) Notice: Subject to any disclaimer, the term of this patent is extended or adjusted under 35 U.S.C. 154(b) by 109 days.

(21) Appl. No.: 14/342,657

(22) PCT Filed: Sep. 6, 2012

(86) PCT No.: PCT/US2012/053834
§ 371 (c)(1),
(2), (4) Date: Sep. 3, 2014

(87) PCT Pub. No.: WO2013/036555
PCT Pub. Date: Mar. 14, 2013

(65) Prior Publication Data
US 2014/0370442 A1  Dec. 18, 2014

Related U.S. Application Data

(60) Provisional application No. 61/531,378, filed on Sep. 6, 2011.

(51) Int. Cl.
*G03F 7/004* (2006.01)
*G03F 7/039* (2006.01)
(Continued)

(52) U.S. Cl.
CPC .............. *G03F 7/039* (2013.01); *C08F 20/22* (2013.01); *C08F 214/18* (2013.01); *C08F 297/026* (2013.01); *G03F 7/0046* (2013.01); *G03F 7/038* (2013.01); *G03F 7/165* (2013.01); *G03F 7/20* (2013.01); *G03F 7/322* (2013.01); *G03F 7/325* (2013.01); *G03F 7/002* (2013.01)

(58) Field of Classification Search
CPC .............. G03F 7/039; G03F 7/20; G03F 7/30; G03F 7/40; C08F 20/22
USPC  430/270.1, 322, 325, 329, 330, 331; 525/94
See application file for complete search history.

(56) References Cited

U.S. PATENT DOCUMENTS 5,907,017 A     5/1999  Ober et al.
7,709,055 B2 *  5/2010  Ober .................. C08F 8/00
                                              427/240

(Continued)

OTHER PUBLICATIONS

Shu et al, "One Pot" synthesis of fluorinated block copolymers using a surface-active ATRP initiator under emulsion polymerization conditions, Polymer Bulletin 67:1185-1200 (2011).*

(Continued)

*Primary Examiner* — Amanda C Walke
(74) *Attorney, Agent, or Firm* — Hodgson Russ LLP

(57) ABSTRACT

Block copolymers and methods of making patterns of organic thin films using the block copolymers. The block copolymers comprise a fluorinated block. Thin films of the block copolymers have microdomains that can be aligned. As a result the patterns of organic thin films having smaller dimensions than the pattern of incident deep-UV or e-beam radiation can be formed. For example, the block copolymers can be used in lithography, filtration, and templating applications.

20 Claims, 5 Drawing Sheets

(51) Int. Cl.
*C08F 214/18* (2006.01)
*C08F 297/02* (2006.01)
*G03F 7/038* (2006.01)
*G03F 7/16* (2006.01)
*G03F 7/32* (2006.01)
*C08F 20/22* (2006.01)
*G03F 7/20* (2006.01)
*G03F 7/00* (2006.01)

(56) References Cited

U.S. PATENT DOCUMENTS

| | | | | |
|---|---|---|---|---|
| 7,790,350 | B2 * | 9/2010 | Breyta | B82Y 10/00 430/270.1 |
| 8,673,541 | B2 * | 3/2014 | Xiao | G03F 7/0002 430/296 |
| 9,073,284 | B2 * | 7/2015 | Hieno | B32B 7/04 |
| 2006/0231525 | A1 * | 10/2006 | Asakawa | B82Y 10/00 216/56 |
| 2009/0035668 | A1 | 2/2009 | Breyta et al. | |
| 2009/0179002 | A1 | 7/2009 | Cheng et al. | |
| 2012/0135146 | A1 * | 5/2012 | Cheng | H01L 21/0337 427/271 |
| 2012/0273460 | A1 * | 11/2012 | Kang | B82Y 30/00 216/49 |
| 2013/0029113 | A1 * | 1/2013 | Nealey | C08F 8/08 428/195.1 |
| 2015/0011700 | A1 * | 1/2015 | Farnham | C08F 6/12 524/562 |
| 2015/0072292 | A1 * | 3/2015 | Cho | G03F 7/0046 430/285.1 |
| 2015/0184024 | A1 * | 7/2015 | Chang | C09D 183/10 428/447 |
| 2015/0351237 | A1 * | 12/2015 | Scholz | H05K 1/056 174/255 |
| 2015/0380239 | A1 * | 12/2015 | Cooper | H01L 21/0274 257/499 |

OTHER PUBLICATIONS

Bosworth, J.K., et al., Selective Area Control of Self-Assembled Pattern Architecture Using a Lithographically Patternable Block Copolymer, ACSNANO, 2009, vol. 3, No. 7, pp. 1761-1766.

Andruzzi, L., et al., Engineering low surface energy polymers through molecular design: synthetic routes to fluorinated polystyrene-based block copolymers, Journal of Materials Chemistry, Apr. 16, 2002, vol. 12, pp. 1684-1692.

Kassis, C.M., et al., XPS Studies of Fluorinated Acrylate Polymers and Block Copolymers with Polystyrene, Macromolecules, 1996, vol. 29, No. 9, pp. 3247-3254.

* cited by examiner

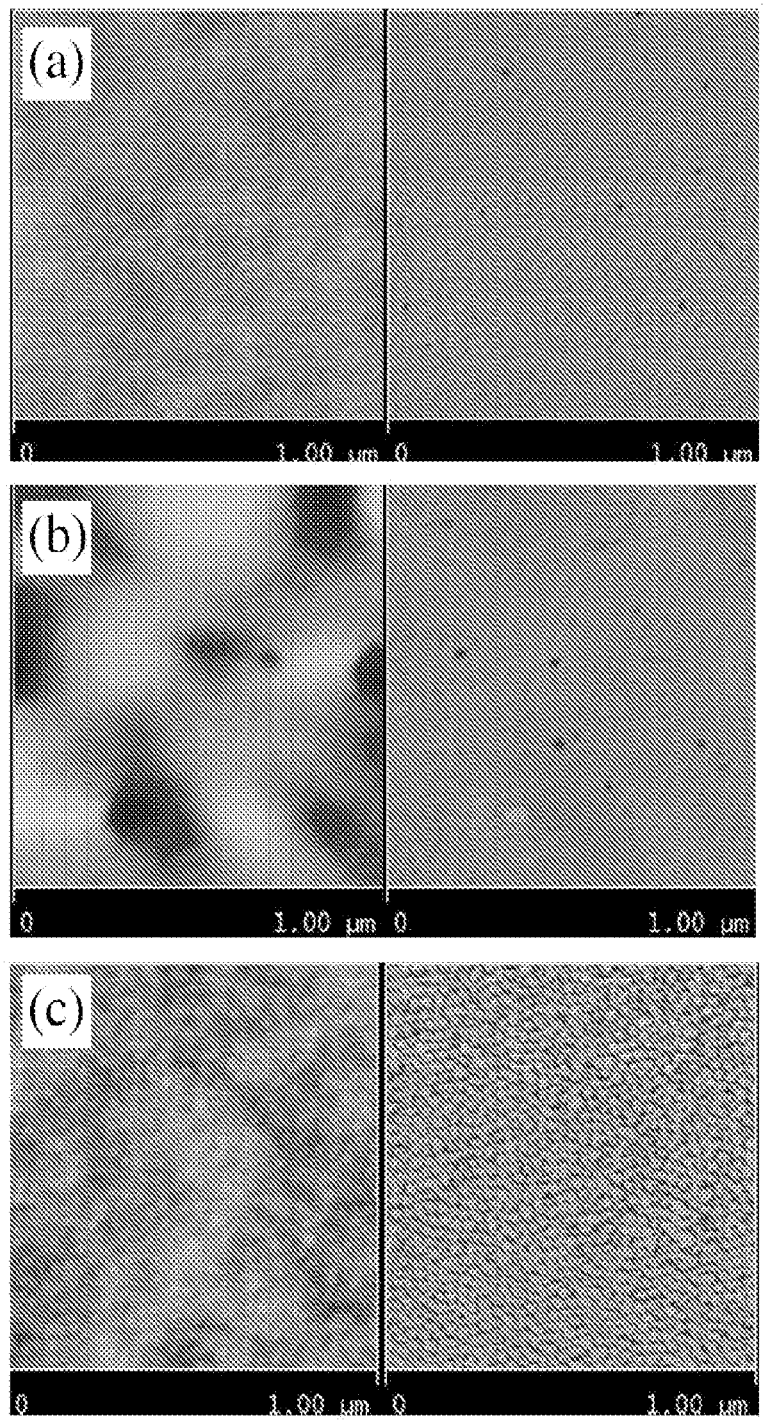
Figures 3 (a) –(c)

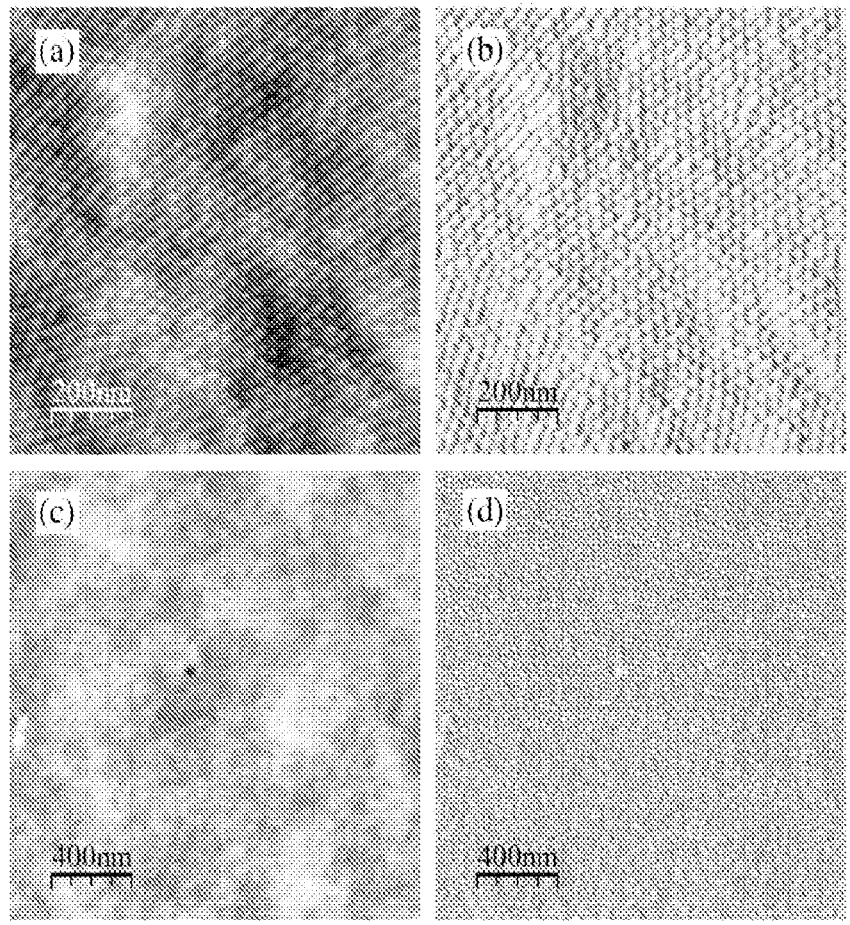
Figures 4 (a) – (d)

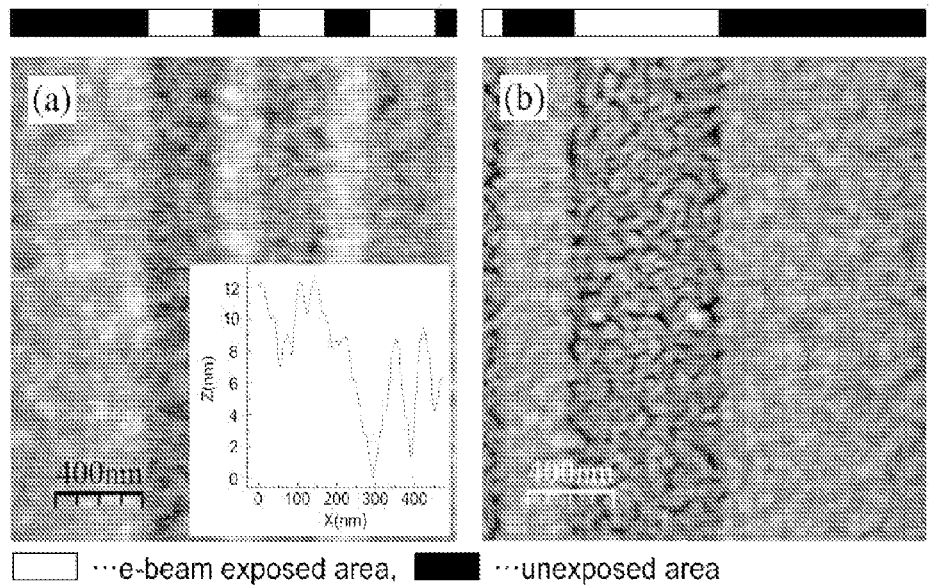
Figures 5 (a) – (b)
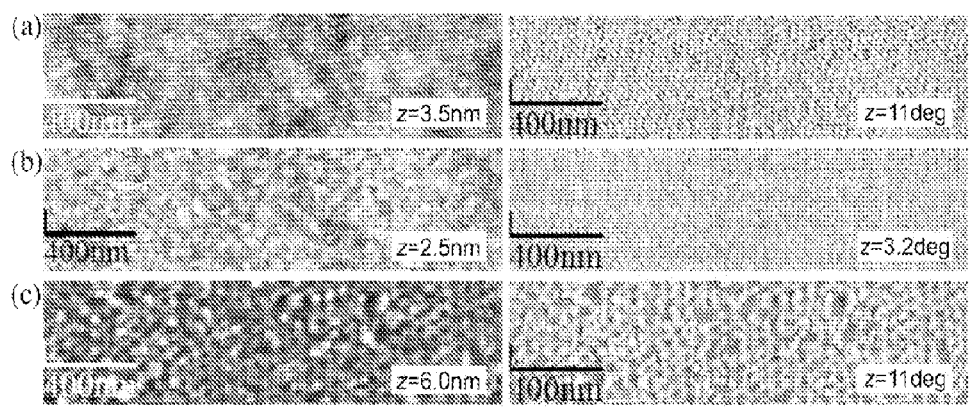
Figures 6 (a) – (c)

BLOCK COPOLYMERS AND LITHOGRAPHIC PATTERNING USING SAME

CROSS-REFERENCE TO RELATED APPLICATIONS

This application claims priority to U.S. provisional patent application No. 61/531,378, filed Sep. 6, 2011, the disclosure of which is incorporated herein by reference.

FIELD OF THE INVENTION

The present invention generally relates to block copolymers and uses thereof. More particularly, the present invention relates to methods of lithographic patterning using the block copolymers.

BACKGROUND OF THE INVENTION

The formation of nanometer-sized structures remains a challenge that limits advances in many fields of nanotechnology such as fabrications of semiconductor integrated circuits (ICs), photonic band gap materials and magnetic storage devices. Emerging candidates to address the need for smaller features are ArF immersion lithography and extreme ultraviolet (EUV) lithography. E-beam lithography has further pushed the feature sizes down to sub 10 nm, but issues such as cost and low throughput still need to be addressed.

To date, several studies have reported block copolymer lithography by starting with a film of self-assembled poly (styrene-block-methyl methacrylate). In this system, one of the most common strategies to generate nanostructures in poly(styrene-block-methyl methacrylate) thin films is selective UV degradation and removal of poly(methyl methacrylate) microdomain. However, components of this block copolymer, polystyrene and poly(methyl methacrylate), have very low sensitivity to deep-UV and e-beam. Therefore, high irradiances are required to make nano-structured films.

Precise location of block copolymer patterns are performed only when a substrate is chemically or topographically modified, limiting the usefulness of this material in further patterning applications. Furthermore, this block copolymer cannot form small microdomains, which is also a crucial problem that limits development of block copolymer lithography.

Poly($\alpha$-methylstyrene-block-hydroxystyrene) has been used in block copolymer lithography. The poly(hydroxystyrene) block acts as a negative-tone photoresist and the second block made of poly($\alpha$-methylstyrene) can be selectively removed under UV irradiation in high vacuum conditions. However, multistep deep-UV irradiation and high vacuum conditions are required for selective removal of the poly($\alpha$-methylstyrene) block, which limits the usefulness of these materials in patterning processes.

BRIEF SUMMARY OF THE INVENTION

In an aspect, the present invention provides methods of forming patterns obtained from novel functionalized polymer resist materials. In an embodiment, the method provides negative-tone patterns (e.g. periodic patterns) formed by block copolymer self-assembly with size of 3-50 nm within the positive-tone pattern artificially drawn by DUV, EUV or e-beam. In another embodiment, the method provides positive-tone patterns (e.g., periodic patterns) formed by block copolymer self-assembly with size of 3-50 nm within the negative-tone pattern artificially drawn by DUV, EUV or e-beam.

In another aspect, the present invention provides block copolymers. The copolymers can be used to form films having nanoporous structure and nanopillared arrays that can be used in applications such as, for example, filtration and templating.

BRIEF DESCRIPTION OF THE FIGURES

FIG. 3. AFM height (left) phase (right) images of PHOST-b-PTFEMA4 films. (a) As-cast, (b) annealed in a THF atmosphere and (c) annealed in a mixture of THF and dipropylene glycol methyl ether atmosphere.

FIG. 4. AFM height (a,c) phase (b,d) images of solvent annealed PS-b-PTFEMA7 (a,b) and PS-b-PTFEMA2 (c,d) films. z Range is 5 nm for height images and 5 degree for phase images.

FIG. 5. AFM height images of the e-beam patterned PT-b-PTFEMA7 film. The e-beam exposure doses used are (a) 65 μC/cm$^2$ and (b) 413 μC/cm$^2$. z Ranges is 32 nm for (a) and 42 nm for (b).

FIG. 6. AFM height (left) and phase (right) images of PS-b-(PTFEMA-co-PMMA) films: (a) annealed in a toluene atmosphere; (b) exposed to DUV; (c) developed in methanol.

DETAILED DESCRIPTION OF THE INVENTION

Figure 1:
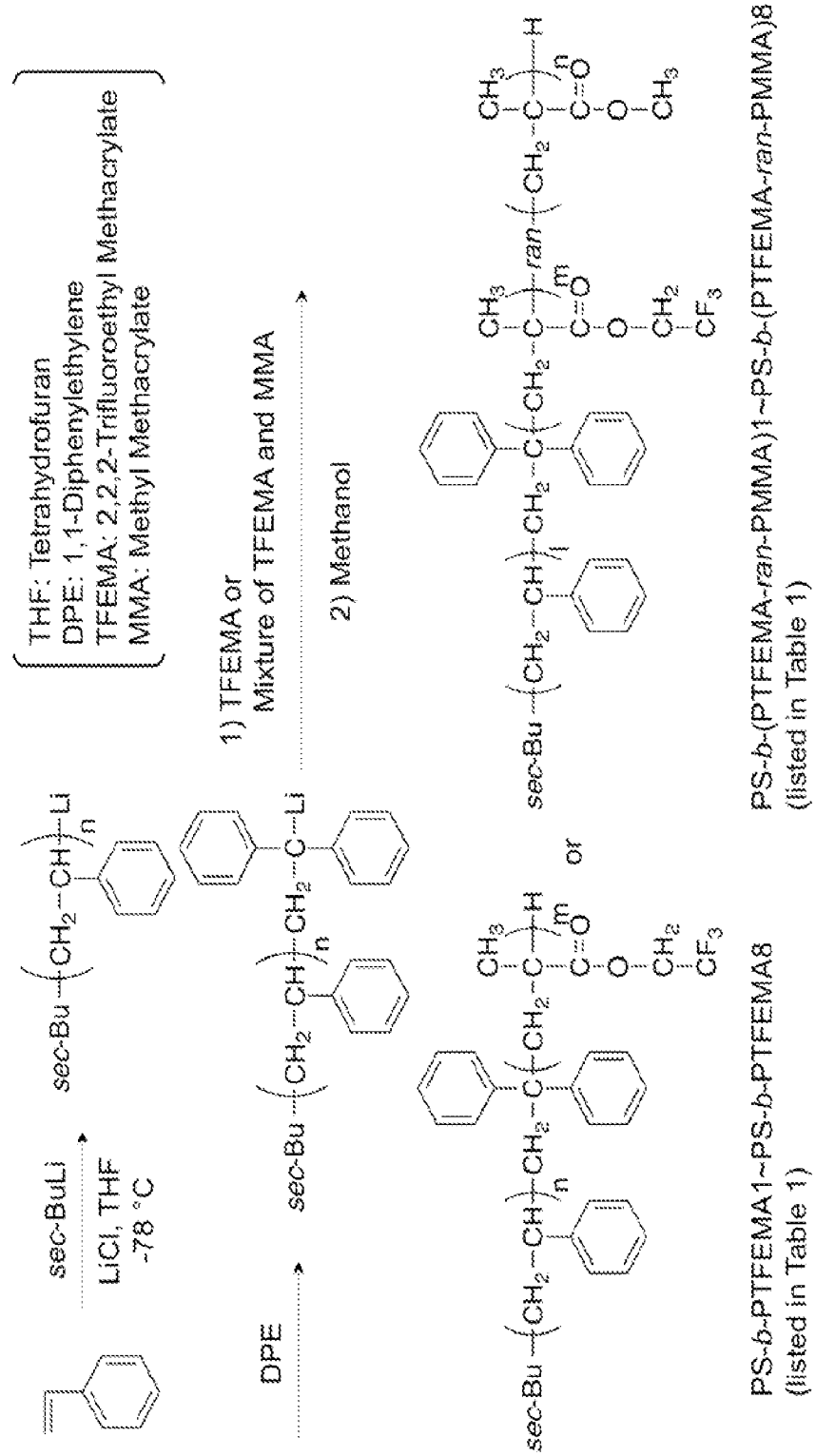
FIG. 1. Synthetic scheme of PS-b-PTFEMA and PS-b-(PTFEMA-co-PMMA).

The present invention provides a method for lithographically defining nanoscale structures. Also provided are block copolymer compositions, which can be used in the methods described herein. The present invention also provides uses of the block copolymers such as, for example, fabrication of lithographically patterned nanoporous thin films, and thin films comprising the block copolymers.

For example, the present invention provides lithographically patternable block copolymers having the following structure:

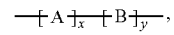

where the A block segment has negative-tone properties and the B block has positive-tone properties. Optionally, the block copolymers contain additional blocks such that they comprise three or more blocks. In such a case, the block copolymer comprises both more than one block with positive-tone properties and more than one block with negative-tone properties. In various embodiments, the block copolymers have two, three, or four blocks. Optionally, the block copolymers can have not only linear structure but also star-like, comb-like, or dendron structure. Examples of such polymers include, but are not limited to, poly(hydroxystyrene-block-2,2,2-trifluoroethyl methacrylate) (PTFEMA) and poly(styrene-block-2,2,2-trifluoroethyl methacrylate).

The nanoporous structure, size range, aspect ratio, and feature size of the patterns can be varied. For example, the aspect ratio of the nanoporous structures can be from 1:1 to 10:1, including all integer values and ranges therebetween.

The present invention is based, at least in part, on the combination, in a block copolymer, of a fluorine-containing block that degrades on exposure to deep UV or e-beam radiation and a negative-tone block having high sensitivity to such radiation. It was surprisingly observed that these block copolymers could be lithographically defined using a method having a single development step to provide integrated features from the combination of well-ordered features on the scale of 10 nm generated from block copolymer and patterns obtained from deep-UV or e-beam lithography. The sizes of well-ordered features in the range of 3-50 nm were measured by atomic force microscope (AFM), scanning electron microscope (SEM) and transmission electron microscope (TEM) images.

To date, there is no facile route to fabricate nanometer-sized structures. The copolymer materials of the present invention can be used in a facile method to fabricate nanometer-sized structures. These copolymers and combination of the copolymers with lithographic technologies are useful in the area of semiconductor IC fabrication and also other fields, such as fabrication of photonic band gap materials and magnetic storage materials. The copolymers and combination of the copolymers with lithographic technologies are also useful for templates, template synthesis (see, e.g., Charles R. Martin et al., Chem.-Eur. J., 2011, 17, 6296-6302, the disclosure of which is incorporated herein by reference), biological substrates (e.g., sensors, diagnostic strips and disposables, scaffolding, hydrophobic surfaces), and antifouling surfaces quantum dot and nanophosphors synethesis (e.g., as templates for growing and templates for ordering nanophosphors in remote phosphor applications, such as for LED lighting).

Block copolymer lithography is attractive as it offers both ease of processing and high resolution. With this approach, microphase separation of the block copolymer generates densely packed arrays of spheres, cylinders, and lamellae with fine tunability of microdomain (e.g., nanodomain) size in thin films upon various substrates, and these patterns are transferred to the substrate or used as templates and scaffolds for magnetic materials or metals using the differences of chemical properties. In various examples, the nanodomain size is 3-50 nm, 3-30 nm, and 3-15 nm. Unlike conventional photoresists, block copolymers can autonomously form regular patterns at dimensions not achievable by conventional lithographic means. The microdomains can be periodic microdomains formed by microphase separation of the block copolymer. Furthermore, the ability of thin films of the block copolymers to have enabled both lateral and vertical ordering of microdomains (e.g., nanodomains) over a large (e.g., 10 by 10 micrometer or 20 by 20 micrometer) almost defect-free (e.g., less than 10 defects per 10 by 10 micrometer area or less than 5 defects/10 by 10 micrometer) area makes such materials useful in lithography applications. The defects can be measured by those having skill in the art.

The block copolymers of the present invention address two important issues in block copolymer lithographic methods. First, only a limited set of pattern geometries can be obtained from conventional block copolymer microdomains, that is, obtaining an artificially-produced integrated multilevel structure is important. Regarding this issue, the present invention uses lithographically patternable block copolymers that can also act as a conventional photoresist or e-beam resist. The bimodal feature of the copolymers of the present invention enables artificial modification of limited variety of the pattern obtained from block copolymer self-assembly (e.g., sphere, cylinder, gyroid, lamellar, etc.), also enables very precise location of the self-assembled block copolymer pattern that can be used for further patterning applications, especially when photo- or e-beam lithography technique is coupled with the selective removal of one of the blocks.

Second, the smallest attainable size of block copolymer microdomains is important as it limits the feature size attainable using this method. "Microdomains" as used herein is meant to include micron scale domains and/or nanometer scale domains (i.e., nanodomains). The size of the microdomains is limited by the product of $\chi N$, where $\chi$ is the Flory-Huggins segmental interaction parameter and N is the number of segments in the block copolymer. While $\chi$ is not dependent on molecular weight, the product $\chi N$ decreases with molecular weight. For $\chi N<10.5$ the block copolymer is phase mixed. Consequently, block copolymers with high $\chi$ values are required to generate small microdomains. The block copolymers of the present invention have $\chi$ values required to generate small (e.g., less than or equal to 20 nm) microdomains.

The novel block copolymers of the present invention composed of, for example, poly(2,2,2-trifluoroethyl methacrylate) (a fluorine-containing polymer, positive-tone resist) combined with poly(hydroxystyrene) or polystyrene (negative-tone resist) can be used in lithography applications. The microdomains of the block copolymers can be aligned laterally and vertically along a substrate. Irradiation (e.g., deep-UV or e-beam) can form lithographic patterns at predetermined positions due to the photo or soft-X-ray or e-beam resist property of the block copolymer. One of the blocks having a positive-tone resist property can be degraded in the deep-UV, soft-X-ray, or e-beam irradiated area. Polymer in the irradiated area can be removed by (e.g., one-step) photoresist-type development, leaving integrated multilevel structures of conventional lithography and block copolymer lithography. In an embodiment, certain components (e.g., poly(2,2,2-trifluoroethyl methacrylate) are also at least partially washed away by one-step development over both the irradiated and non-irradiated areas.)

In an embodiment, the irradiation can take place after alignment of the microdomains. In another embodiment, at least partial irradiation can take place during the formation or annealing steps. Other irradiation (e.g., polarized UV, coherent laser field, infrared, pulsed deep-UV) are optionally envisioned during the formation of the film or microdomains. In other embodiment, polymers in a not irradiated area can also be washed away by development (e.g., one-step or either multi-step development).

Furthermore, in a preferred embodiment it can be desirable to use a fluorinated polymer block, poly(2,2,2-trifluoroethyl methacrylate), that can provide high $\chi$ value to the block copolymer due to its fluorinated methyl groups. As a result, microphase domain separation sizes as small as 10 nm or less can be obtained. Examples of additional blocks with similar properties include:

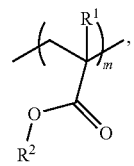

where $R^1$ is —H, —$CH_3$, —Cl, —Br, —I, —F, —$CCl_3$, —$CBr_3$, or —$CF_3$, and $R^2$ is -methyl, -ethyl, -n-butyl, -sec-butyl, -iso-butyl, -tert-butyl, —Cl, —Br, —I, —F, —CCl$_3$, —CBr$_3$, —CF$_3$, —CH$_2$CF$_3$, —CH$_2$CHFCF$_2$CF$_3$, —CF$_2$CF$_3$, —CF$_2$CF$_2$CF$_3$, —CF$_2$CF$_2$CF$_2$CF$_3$. The value of m is from 5 to 10000, including all integer values and ranges therebetween.

The block copolymers of the present invention have at least the following advantages:

(1) High sensitivity of at least the positive-tone blocks (more preferably all of the positive-tone and negative-tone blocks) toward irradiation (e.g., deep-UV, e-beam, soft x-ray). For example, poly(2,2,2-trifluoroethyl methacrylate), which can be one of the blocks of the block copolymers describe herein, is 10 times more sensitive toward e-beam radiation than poly(methyl methacrylate). Poly(hydroxystyrene) mixed with photo acid generator and crosslinker is 60 times more sensitive than polystyrene because it functions as a chemically amplified photoresist. These properties result in lower dose requirements and shorter exposure times, resulting in cost savings. If the block copolymer does not have photo or e-beam or soft X-ray sensitivity, it would be impossible to produce photo or e-beam or soft X-ray structures combined with self-assembled structure. For example, polystyrene-block-polylactide can produce self-assembled structure and nanoporous films by selective removal of polylactide using an aqueous sodium hydroxide solution. In this case, the place in which porous structures are made cannot be chosen. Because the entire film of polystyrene-block-polylactide is soaked into the aqueous sodium hydroxide solution porous features merges throughout entire film.

(2) The ability to make small microphase-separated structure results from high χ value of block copolymers. For example, a minimum phase-separation distance of 18 nm was easily obtained from poly(styrene-block-2,2,2-trifluoroethyl methacrylate), while arrays of hexagonally close packed pores with diameters of 14-50 nm, separation distances of 24-89 nm could be obtained from poly(styrene-block-methyl methacrylate), although they have both negative-tone resist block and positive-tone resist block. A large χ value also reduces the number of defects.

(3) The ability to form integrated conventional lithographic patterns and self-assembled nanostructures with only one-step development (preferably only one-step) after deep-UV or e-beam irradiation. Notable features different from conventional e-beam or DUV or soft X-ray resist are having both characteristics of positive-tone and negative-tone resist in one resist material (e.g., periodic arrays of positive-tone structures with 3-50 nm size in negative-tone matrix or periodic arrays of negative-tone structures with 3-50 nm size in positive-tone matrix, these structures are derived from block copolymer self-assembly). It can be difficult, and in some cases not possible, to obtain features with 3-50 nm size by conventional photolithography (e.g., DUV, EUV, e-beam lithography). Even if such feature sizes can be made using conventional lithography, it cannot be done in a cost effective manner. The difference between the polymers of the present invention and conventional block copolymers such as polystyrene-block-polydimethylsiloxane, polystyrene-block-polyethylene oxide, polystyrene-block-polylactic acid, PS-block-polyisoprene with degradable (sacrificial) block is that all the conventional polymers require solution processing for selective etching of polydimethylsiloxane, polyethylene oxide, polylactic acid, and polyisoprene, respectively. (Polydimethylsiloxane can be etched by hydrogen fluoride (HF), polyethylene oxide can be etched by hydrogen iodide (HI) solution, polylactic acid can be etched by sodium hydroxide solution, polyisoprene can be etched by ozone/dichloromethane solution.) Periodic nano-size features or nanopores can be obtained from these conventional block copolymers, but these are not patternable. Even if polystyrene is used as a negative-tone resist, if the other component is not positive-tone resist these block copolymers do not work as "patternable" resist. From these "not patternable block copolymer," only a simple periodic pattern which covers the whole surface of a substrate can be obtained.

In an aspect, the present invention provides methods of forming patterns of organic thin films. In an embodiment, the method of forming a patterned organic thin film comprises the steps of: a) providing a substrate; b) forming a thin film of a block copolymer comprising a positive-tone polymer block and a negative-tone polymer block, wherein the thin film has periodic microdomains; c) aligning the periodic microdomains of the thin film; d) exposing a portion of the thin film from b) to deep-UV or e-beam radiation to differentially affect the positive-tone polymer blocks and negative-tone polymer blocks in the exposed portion of the thin film such that an exposed pattern, and, optionally, an unexposed portion, of thin film is/are formed; and e) exposing the thin film from d) to a solvent such that the unexposed portion of block copolymer thin film and selected regions of the exposed portion of the thin film are removed, and a patterned organic thin film of the negative-tone polymer blocks or a patterned organic thin film of the positive-tone polymer blocks is formed.

In an embodiment, the present invention provides a negative-tone method of forming patterns of organic thin films. By "negative tone" it is meant that the pattern of organic thin film is formed from negative-tone blocks of the block copolymer which have been rendered insoluble in a solvent or mixture of solvents as a result of exposure to deep-UV, e-beam, or soft X-ray radiation. The negative-tone blocks can be rendered insoluble as a result of cross-linking (i.e., formation of at least one covalent bond between the blocks) the blocks.

For example, a negative-tone method of forming a pattern of organic thin films comprises the steps of: a) providing a substrate; b) depositing a thin film of a block copolymer comprising a positive-tone polymer block and a negative-tone polymer block, wherein the thin film has periodic microdomains; c) aligning the periodic microdomains of the thin film; d) exposing at least a portion of the thin film from step b) to deep-UV or e-beam radiation to differentially affect the positive-tone polymer blocks and negative-tone polymer blocks in the exposed portion of the thin film such that an exposed pattern in which the positive-tone polymer blocks are degraded is formed; and e) exposing the thin film from step d) to a solvent such that the unexposed portion of block copolymer and the exposed portion of the positive-tone polymer blocks are removed (preferably in one step), where a patterned organic thin film of the negative-tone polymer blocks is formed.

In an embodiment, the present invention provides positive-tone methods of forming patterns of organic thin films. By "positive tone" it is meant that the pattern of organic thin film is formed from positive-tone blocks of the block copolymer which have been rendered soluble in a solvent or mixture of solvents as a result of exposure to deep-UV or e-beam radiation.

For example, a positive-tone method of forming a pattern of organic thin film comprises the steps of: a) providing a substrate; b) depositing a thin film of a block copolymer comprising a positive-tone polymer block and a negative-tone polymer block, wherein the thin film has periodic microdomains; c) aligning the periodic microdomains of the thin film; d) exposing at least a portion of the thin film from b) to deep-UV or e-beam radiation to differentially affect the positive-tone polymer blocks and negative-tone polymer blocks in the exposed portion of the thin film such that an exposed pattern is formed in which the positive-tone polymer blocks are degraded and negative-tone polymer blocks are crosslinked; and e) exposing the thin film from d) to a solvent such that the exposed portion of degraded positive-tone block is removed and negative-tone block is not removed, where a patterned organic thin film of the positive-tone polymer blocks is formed.

The negative-tone block (e.g., A block), positive-tone block (e.g., B block), or both may comprise a cross-linkable moiety. It is desirable that the A block have crosslinkable moieties. For example, the block can have a cross-linkable moiety which on cross-linking (e.g., as a result of exposure to deep-UV or e-beam radiation) provides desirable etch resistance. Such moieties are known in the art.

In an embodiment, in the patterning methods described herein the entire film can be exposed to deep-UV or e-beam radiation. If flood exposure is used, a continuous pattern of material can be formed based on the selective removal of one of the blocks as described in the methods of the present invention.

Any substrate suitable for formation of a block copolymer thin film can be used. The substrate can have other materials deposited on it before deposition of the thin film of block copolymer. Examples of suitable substrates include, for example, Si, SiN, organic films (e.g., PET, polyimide, and the like), metallic substrates (e.g., gold, copper, steel, etc.), glass substrates (e.g., the thin film can be irradiated through the side of the substrate opposite that of side on which the thin film is deposited). Flexible films can be used. The substrates should be compatible with solvent(s) used in the methods. Other examples of suitable substrates include substrates used in conventional lithography processes and nanoimprint processes. For example, using the compositions and methods of the present invention a top layer on a PV cell or integrated circuit can be formed. The substrate can be chemically modified. The thin film of block copolymer can be conformally coated. Accordingly, substrates with high degrees of surface roughness can be used. As another example, the block copolymer can be applied using a roll-to-roll process. Non-planar substrates can be used. For example, substrates having a curvature radius of from 1 nm to 10 m can be used. The substrate shape can be conformal or non-conformal (e.g., triangular, pentagonal, hexagonal, round, etc). Suitable substrates are commercially available.

The block copolymer can be deposited on the substrate by methods known in the art. Suitable methods include, for example, spin coating, dip coating, zone casting, doctor blade method, and spray coating. The thickness of the copolymer thin film can be from 10 nm to 1 mm, including all values to the nanometer and ranges therebetween.

In an embodiment, the thin film is nanoporous. The film can have a plurality of nanoscale pores as a result of removal of one of the blocks (e.g., selective removal of one of the blocks using the patterning methods disclosed herein). For example, a patterned film can have pore sizes of from 3 nm to 50 nm and a density of pores of from 50 megabit to 10 terabits per square inch, including all values to the megabit per square inch and ranges therebetween.

The block copolymer thin films have microdomains. Examples of microdomains include, but are not limited to, spheres, cylinders, gyroid, and lamellars. The microdomains can be aligned. Suitable methods for aligning the microdomains include, for example, zone-cast technique, and chemical or topological modification of the substrate followed by annealing. Examples of annealing include thermal annealing (e.g., at temperatures of 50° C. to 250° C.) or solvent annealing (e.g., exposure to solvents such as 1,4-dioxane, 2-propanol, acetone, benzene, carbon disulfide, chloroform, cyclohexane, dichloromethane, diethyl ether, N,N-dimethylformamide, dimethyl sulfoxide, ethanol, ethyl acetate, ethylene glycol, hexane, methanol, tetrahydrofuran, toluene, $\alpha,\alpha,\alpha$-trifluorotoluene, dipropylene glycol methyl ether).

Alignment achieves long-range ordered structures in lateral and/or vertical directions. Examples of processes/methods for achieving alignment include use of external stimuli, such as electric field, magnetic field, or shear (e.g., roll casting), orientation during solvent evaporation, graphoepitaxy, and alignment on lithographically patterned substrates.

In the as-casted thin film, self-assembly of block copolymer can be randomly oriented. The self-assembled structure can be aligned using external filed (e.g., electric field or magnetic field or shear in the case where the periodic microdomains have magnetic, electrical or mechanical anisotropy, respectively). Alignment can also be performed during solvent evaporation by controlling, for example, polymer kinetics, interfacial energy, and shear induced by fast solvent evaporation. In graphoepitaxy, the surface relief structure of the substrate directs epitaxial growth of an overlying block copolymer film during heating. On lithographically patterned substrates, the block copolymer is oriented and registered with the underlying substrate.

The copolymer thin film with aligned periodic domains is exposed to electromagnetic radiation, such as, for example, deep-UV or electron-beam (e-beam) radiation such that exposed regions and unexposed regions of the film are formed. For example, well-known masking methods or direct-write methods can be used to expose desired regions of the film to electromagnetic radiation.

The radiation differentially affects the positive-tone and negative-tone polymer blocks of the copolymer. For example, the solubility of the negative-tone polymer blocks in the exposed area is altered (e.g., rendered insoluble in a desired solvent) as a result of exposure of to the electromagnetic radiation. Further, the positive-tone blocks in the exposed region are degraded. The degraded blocks are soluble in a solvent or mixture of solvents and removed from the substrate.

After exposure to electromagnetic radiation, the thin film is exposed to a solvent or mixture of solvents. This step is commonly referred to in the art as development. Any solvent or mixture of solvents (e.g., organic solvents, aqueous solvents, and mixtures thereof) which selectively removes polymer(s) resulting in a pattern of organic thin film can be used. Examples of solvents and mixtures of solvents include acetic acid, methanol, methyl isobutyl ketone:isopropyl alcohol 3:1 to 1:3, and tetramethyl ammonium hydroxide aqueous solution (1-30 wt %). For example, the unexposed portion of the block copolymer thin film is removed. As a result, a patterned thin film of polymer (e.g., negative-tone blocks) is formed. The patterned thin film has features from, for example, 3 nm to 50 nm in size.

In an aspect, the present invention provides block copolymers. In an embodiment, the copolymers comprise a styrene and/or hydroxystyrene block (or substituted analogs thereof) and a fluorinated block.

The styrene block (or substituted styrene block) is formed from polymerization of styrene monomers (or substituted styrene monomers). The styrene block (or substituted styrene block) can have from 5 to 1000 styrene repeat units, including all ranges and integer repeat unit values therebetween.

The hydroxystyrene block (or substituted hydroxystyrene block) is formed from polymerization of hydroxystyrene (or substituted hydroxystyrene monomers). Optionally, protected hydroxystyrene (e.g., protected with a t-butyl group) is polymerized. The hydroxystyrene block (or substituted hydroxystyrene block) can have from 5 to 1000 hydroxystyrene repeat units, including all ranges and integer repeat unit values therebetween.

The fluorinated block comprises fluorine-containing repeat units. In an embodiment, the fluorinated block comprises a mixture of fluorinated alkyl methacrylate repeat units and non-fluorinated alkyl methacrylate repeat units. Without intending to be bound by any particular theory, it is considered that the mixture of fluorinated and non-fluorinated methacrylate repeat units results in a copolymer with reduced crystallinity and a desirable rate of imaging.

For example, the fluorinated block can be formed by polymerization of fluorinated alkyl methacrylate or a mixture of fluorinated alkyl methacrylate and non-fluorinated methacrylate. The fluorinated block can have from 5 to 1000 monomer repeat units, including all integer repeat unit values and ranges therebetween.

In an embodiment, the block copolymers have the following structure:

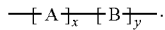

Optionally, the block copolymers can comprise an additional block or additional blocks. In various embodiments, the block copolymers further comprise one, two or three additional blocks.

The A blocks can be formed from styrene, hydroxystyrene, or substituted analogs thereof. For example, the A block is a polystyrene block, polyhydroxystyrene block, or mixture (i.e., copolymer) thereof. Other examples include poly(4-hydroxystyrene), poly(p-chlorostyrene), poly(p-bromostyrene), poly(p-iodostyrene), poly(p-chloromethylstyrene), poly(glycidyl methacrylate), poly(vinylbenzylchloride), poly(vinylbenzoate) or copolymers thereof.

It is desirable that the A block have crosslinkable moieties. For example, the block can have a cross-linkable moiety which on cross-linking (e.g., as a result of exposure to deep-UV or e-beam radiation) provides desirable etch resistance. Such moieties are known in the art. This block is referred to herein as the "negative-tone block".

For example, where the copolymers are used as a photoresist materials it is preferable the A block be poly(4-hydroxystyrene), poly(p-chlorostyrene), poly(p-bromostyrene), poly(p-iodostyrene), poly(p-chloromethylstyrene), poly(vinylbenzylchloride), poly(vinylbenzoate), or a mixture thereof because such blocks have a desireable dry etching (e.g., reactive ion etching) resistance. Also, it is more preferable the A block be poly(4-hydroxystyrene), poly(p-chlorostyrene), poly(p-bromostyrene), poly(p-iodostyrene), poly(p-chloromethylstyrene), poly(vinylbenzylchloride), poly(vinylbenzoate) or a mixture thereof because such blocks have desirable sensitivity toward DUV, e-beam and soft X-ray and also desirable dry etching resistance.

B is a fluorinated block. This block is referred to herein as the "positive-tone block." The fluorinated block is formed from at least one fluorinated monomer. For example, the fluorinated block can be formed from a fluorinated monomer or a mixture of fluorinated monomer and non-fluorinated monomer(s). The fluorinated monomer has at least one fluorine substituent. The fluorinated monomer can be partially fluorinated or completely fluorinated. For example, the fluorinated monomer can have a partially fluorinated alkyl group or a perfluorinated alkyl group. Examples of fluorinated blocks include poly(fluoromethacrylate)s. Examples of non-fluorinated blocks include poly(methacrylate)s. In various patterning embodiments, the B block is sacrificial, it is not part of the final pattern of thin film organic. It is desirable that the fluorinated block be degraded on exposure to deep-UV or e-beam radiation. For example, it is desirable that the fluorinated block be selectively removable (e.g., on exposure to a solvent or mixture of solvents or removed on exposure to deep-UV or e-beam radiation) from the A block.

The values of x and y represent the number of monomer repeat units in a block. The value of each x and y is independently from 5 to 10000, including all integers and ranges therebetween. In an embodiment, the value of each x and y is from 5 to 1000. It is preferable the x and y values provide desirable χN (values) and volume fractions for the A and B blocks, respectively.

In an embodiment, the negative-tone block is the majority component of the block copolymer. In another embodiment, the positive-tone block is the majority of the block copolymer.

The primary structures of the block copolymers can be linear or non-linear. For example, the block copolymers can have comb-like structures and branching structures (e.g., dendron, hyper-branched, and star-like structures).

The block copolymers can be terminated independently at each terminus with groups such as, for example, hydrogen, hydroxyl (—OH), carboxyl (—COOH), amino group (—NH$_2$). In various embodiments, the block copolymer is terminated with the same or different groups. In various embodiments, the block copolymer is one of the polymers described in Table 1.

The optional block(s) is/are any block(s) which provides desirable properties to the block copolymer. The block(s) can be a homopolymer block(s) or copolymer block(s). The block(s) can provide desirable properties such as, for example, etch resistance, phase properties, and molecular transport properties. For example, the block can have a cross-linkable moiety which on cross-linking (e.g., as a result of exposure to deep-UV or e-beam radiation) provides desirable etch resistance. Such moieties are known in the art.

The block copolymers have a molecular weight of from 3 to 150 kg/mol, including all values to the kg/mol and ranges therebetween. The block copolymers have a polydisperity index (PDI) ($K_w/M_n$) from 1.01 to 1.50, including all values to 0.01 and ranges therebetween. The molecular weight can be determined by techniques known in the art such as, for example, size exclusion chromatography (SEC).

The block copolymers of the present invention can be made by methods known in the art. For example, the polymers can be synthesized by living anionic polymerization and living radical polymerization methods known in the art.

In an embodiment, the present invention provides compositions comprising the block copolymers of the present invention. For example, the composition can be a photoresist comprising the block copolymers. Such a composition can further comprise other components commonly found in photoresist compositions known in the art.

In an aspect, the present invention provides a film comprising the block copolymers of the present invention. For example, the film can have a thickness of from 10 nm to 100 µm. For use in filtration applications the film can have a thickness of from, for example, 30 nm to 100 µm. For use in templating applications the film can have a thickness of from, for example, 10 nm to 100 µm.

In an aspect, the present invention provides uses of the polymers of the present invention. In an embodiment, nanoporous films prepared using the block copolymers of the present invention can be used as filtration membranes. Such filtration membranes can be used in applications such as, for example, virus filtration, which takes advantages of low pore size distribution and high pore density of the films.

In another embodiment, nanoporous films prepared using the block copolymers of the present invention can be used as a template for dye-sensitized solar cells. In this application, improved control of the pore mesostructure provided the polymers of the present invention, relative to other blend materials, provides significant improvements in device performance and large area reproducibility.

The following examples are presented to illustrate the present invention. They are not intended to limiting in any manner.

EXAMPLE 1

Synthesis. A series of block copolymers designed with the negative-tone photoresist (polyhydroxystyrene (PHOST) or polystyrene (PS)) and the positive-tone photoresist (poly(2,2,2-trifluoroethylmethacrylate) (PTFEMA) or poly(2,2,2-trifluoroethyl methacrylate-co-methyl methacrylate) (PTFEMA-co-PMMA)) were synthesized by living anionic polymerization in the presence of sec-BuLi as an initiator. The synthetic scheme of PS-b-PTFEMA and PS-b-(PTFEMA-co-PMMA) are illustrated in FIG. 1. All reactions were carried out in 10-fold excess of LiCl and 4-fold excess of 1,1-diphenylethylene (DPE) against sec-BuLi as both PTFEMA and PMMA have carbonyl groups. To obtain a PHOST block, it is necessary to protect the hydroxyl group before polymerization to avoid the termination of living chain end group, therefore a tert-butyl ether protected monomer was used to obtain poly(tert-butyl hydroxystyrene) (PtBuOS), and the hydroxyl group was deprotected after the polymerization. Results of polymerization are summarized in Table 1.

TABLE 1

Characterization Data of Block Copolymers via Anionic Polymerization

| Entry | $M_n$ of 1st Block[a] | $M_a$[b] | PDI[c] | $f_{2nd\ block}$[d] | $f_{MMA}$[e] |
|---|---|---|---|---|---|
| PtBuOS-b-PTFEMA1 | 108K | 142K | 1.17 | — | |
| PtBuOS-b-PTFEMA2 | 84.0K | 61.0K | 1.10 | — | |
| PtBuOS-b-PTFEMA3 | 49.0K | 71.6K | 1.09 | — | |
| PtBuOS-b-PTFEMA4 | 17.0K | 28.3K | 1.10 | — | |
| PS-b-PTFEMA1 | 29.4K | 32.3K | 1.08 | 0.10 | — |
| PS-b-PTFEMA2 | 24.3K | 30.7K | 1.07 | 0.20 | — |
| PS-b-PTFEMA3 | | 18.5K | 1.12 | 0.26 | — |
| PS-b-PTFEMA4 | | 31.7K | 1.08 | 0.26 | — |
| PS-b-PTFEMA5 | | 30.7K | 1.07 | 0.28 | — |
| PS-b-PTFEMA6 | | 26.2K | 1.36 | 0.31 | — |
| PS-b-PTFEMA7 | 12.6K | 44.3K | 1.29 | 0.73 | — |
| PS-b-(PTFEMA-co-PMMA)1 | 34.9K | 40.1K | 1.06 | 0.15 | 0.05 |
| PS-b-(PTFEMA-co-PMMA)2 | 34.2K | 44.6K | 1.11 | 0.28 | 0.13 |
| PS-b-(PTFEMA-co-PMMA)3 | 30.1K | 44.1K | 1.16 | 0.38 | 0.08 |

[a]Relative $M_n$'s of the 1st block were measured by SEC using polystyrene standards for calibration.
[b]Relative total $M_n$'s were measured by SEC using polystyrene standards for calibration.
[c]Polydispersity index (PDI) defined as the ratio of weight-average of molecular weight to number-average of molecular weight measured by SEC.
[d]Volume fractions of $2^{nd}$ block were calculated from density of homopolymers and the ratio of polymerization degree calculated from the $^1$H-NMR spectra.
[e]Volume fractions of MMA were calculated from density of MMA and the ratio of polymerization degree calculated from the $^1$H-NMR spectra.

Figure 2:
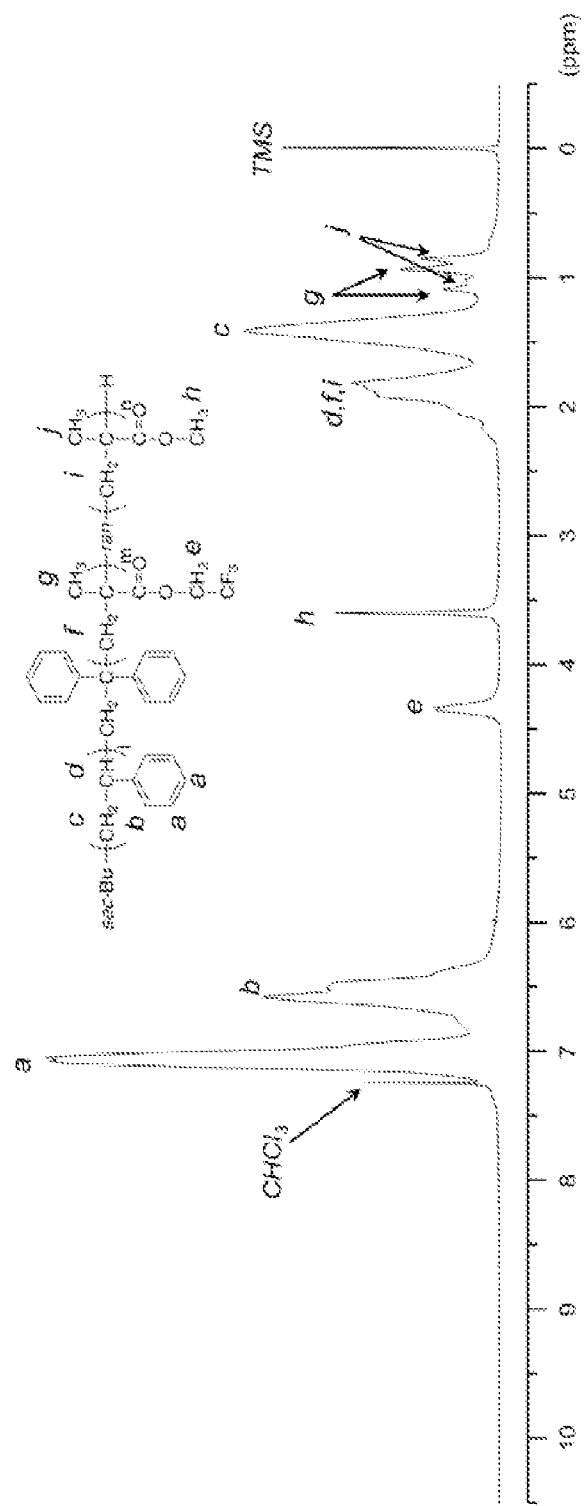
FIG. 2. $^1$H-NMR spectrum of PS-b-PTFEMA in CDCl$_3$.

PtBuOS-b-PTFEMA with total molecular weight of 28.3K~142K (PtBuOS-b-PTFEMA1~PtBuOS-b-PTFEMA4), PS-b-PTFEMA with total molecular weight of 18.5K~79.0K (PS-b-PTFEMA1~PS-b-PTFEMA8) and PS-b-(PTFEMA-co-PMMA) with total molecular weight of 18.5K~79.0K (PS-b-(PTFEMA-co-PMMA)1~PS-b-(PTFEMA-co-PMMA)3) were obtained with narrow polydispersity indices. Relative molecular weights measured by SEC were calibrated against PS linear standard. The structures of obtained block copolymers were characterized by FT-IR and NMR spectroscopy. The $^1$H-NMR spectrum of PS-b-(PTFEMA-co-PMMA) is shown in FIG. 2. The signal from 6.0 to 7.5 ppm was assigned to aromatic protons of PS. The adjacent protons to trifluoromethyl group in PTFEMA were observed at 4.5 ppm. The signal from 3.6 ppm was assigned to methyl group of PMMA. The other proton signals, carbon signals in the $^{13}$C-NMR spectra and peaks in IR spectra were also successfully assigned with the final products. Analysis of the FT-IR and NMR spectra confirmed the desired all structures of diblock copolymers PHOST-b-PTFEMA, PS-b-PTFEMA and PS-b-(PTFEMA-co-PMMA).

Microphase-Separated Structures of the Block Copolymers in Thin Films.

To investigate the microphase separation behavior of the polymers in thin films, films of PHOST-b-PTFEMA4, PS-b-PTFEMA2, PS-b-PTFEMA7 and PS-b-(PTFEMA-co-PMMA)1 with thickness of ~30-120 nm were prepared onto pre-cleaned Si wafer, annealed subsequently in appropriate solvent atmospheres. The morphologies in resulting films were investigated by atomic force microscopy (AFM). FIG. 3a shows AFM images of PHOST-b¬-PTFEMA4 spin-casted from dipropylene glycol methyl ether solution. The film thickness of 120 nm was measured by profilometry. A cylindrical structure oriented parallel to the substrate was observed in the thin film annealed with tetrahydrofuran (THF), a good solvent for both polymer blocks (FIG. 3b). FIG. 3c shows array of dots occurring over large areas of the film annealed with a mixture of THF and dipropylene glycol methyl ether. FIG. 4a and b show AFM images of the PS-b-PTFEMA7 film with a thickness of 39 nm PS-b-PTFEMA7 which contains a large volume fraction of PTFEMA (73%) film annealed in an α,α,α-trifluorotoluene atmosphere showed a well ordered hexagonal dots structure. However, PS-b-PTFEMA2 which contains a small volume fraction of PTFEMA (20%) showed poorly ordered structure after annealing in benzene atmosphere (FIG. 4c, d). Either slight volume change of PTFEMA (PS-b-PTFEMA1~PS-b-PTFEMA6) or other annealing conditions did not result in any improvement effect on the ordering of microphase-separated structure. In contrast, well ordered hexagonal-packed dot arrays were observed in the thin film of PS-b-(PTFEMA-co-PMMA)1 which contained a small volume fraction of PTFEMA-co-PMMA (15%) after annealing in a toluene atmosphere (FIG. 6a, b). We suspect that PTFEMA-co-PMMA block, whose crystallinity is less than that of PTFEMA, formed better-ordered microphase-separated structure.

Lithographic Characteristics of the Block Copolymers.

In this patternable block copolymer system, PHOST and PS were designed as a negative-tone photoresist, and PTFEMA and PTFEMA-co-PMMA were designed as a positive-tone photoresist. Also, these polymers are known as an electron resist. Exposure to DEEP-UV (approximately 250 nm) or e-beam irradiation triggers a crosslinking of PS and degradation of PTFEMA or PTFEMA-co-PMMA. FIG. 5 shows AFM topographic images of PS-b-PTFEMA7 thin films after the e-beam irradiation and the subsequent development by methyl isobutyl ketone/isopropanol (⅓ vol/vol) mixture (AFM images of an unexposed film are shown in FIG. 4a, b). E-beam dose of 65 mC/cm² crosslinks the dot arrays of PS and induces degradation of TFEMA (FIG. 5a). A film thickness decrease of 12 nm was observed in the exposed regions (FIG. 5a inset) from an original film thickness of 39 nm after development. The low contrast between exposed and unexposed area is due to the relatively lower e-beam dose of 65 mC/cm². On the other hand, a higher e-beam dose of 413 mC/cm² resulted in a much higher contrast between exposed and unexposed area, but crosslinked PS dot arrays were not clear in exposed area. This result could be attributed to the degradation rate of PTFEMA much higher than crosslinking rate of PS, which results in disordered crosslinked PS arrays (FIG. 5b).

The deep-UV lithographic characteristics of PS-b-(PTFEMA-co-PMMA) were also explored. FIG. 6b shows AFM topographic images obtained from a PS-b-PTFEMA7 thin film after 25 J/cm² deep-UV irradiation, and FIG. 6c shows images of the films rinsed in methanol after deep-UV irradiation. No change was observed before and after deep-UV irradiation (FIG. 6a,b). Finally hexagonally ordered arrays of holes were obtained by a rinsing in methanol due to the degradation of PTFEMA-co-PMMA block (FIG. 6c).

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A method of forming a patterned organic thin film comprising the steps of:
   a) providing a substrate;
   b) forming a thin film of a block copolymer comprising a positive-tone polymer block and a negative-tone polymer block on the substrate, wherein the thin film has periodic microdomains;
   c) aligning the periodic microdomains of the thin film;
   d) exposing at least a portion of the thin film from b) to deep-UV or e-beam radiation to differentially affect the positive-tone polymer blocks and negative-tone polymer blocks in the exposed portion of the thin film such that an exposed pattern, and, optionally, an unexposed portion, of thin film is/are formed; and
   e) exposing the thin film from d) to a solvent such that the unexposed portion of the block copolymer thin film, if present, and selected regions of the exposed portion of the thin film are removed, and a patterned organic thin film of the negative-tone polymer blocks or a patterned organic thin film of the positive-tone polymer blocks is formed.

2. The method of claim 1, wherein the negative-tone block comprises at least one crosslinkable moiety, in step d) the positive-tone polymer blocks are degraded and negative-tone polymer blocks are crosslinked, and in step e) the patterned organic thin film of the negative-tone polymer blocks is formed.

3. The method of claim 1, wherein the block copolymer further comprises one, two, or three additional blocks.

4. The method of claim 1, wherein the block copolymer has the following structure:

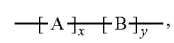

wherein the A block is the negative-tone block selected from polystyrene block, polyhydroxystyrene block, substituted analog thereof, and a mixture thereof and the B block is the positive-tone block and is a fluorinated block comprising at least one fluorinated monomer, and wherein x and y are each independently from 5 to 10,000.

5. The method of claim 4, wherein the fluorinated monomer is a fluoromethacrylate monomer.

6. The method of claim 4, wherein the A block is poly(4-hydroxystyrene), poly(p-chloro styrene), poly(p-bromostyrene), poly(p-iodostyrene), or poly(p-chloromethylstyrene).

7. The method of claim 4, wherein the B block is a poly(fluromethacrylate) or poly(fluoromethacrylate-co-methacrylate).

8. The method of claim 4, wherein the B block is poly(2,2,2-trifluoroethylmethacrylate) or poly(2,2,2-trifluoroethyl methacrylate-co-methyl methacrylate).

9. The method of claim 4, wherein the A block is a styrene block or a hydroxystyrene block, wherein the fluorinated block comprises fluorinated alkyl methacrylate repeat units or a mixture of fluorinated alkyl methacrylate and alkyl methacrylate, and wherein the fluorinated alkyl methacrylate block has from 5 to 1000 fluorinated alkyl methacrylate repeat units and from 0 to 950 alkyl methacrylate repeat units.

10. The method of claim 4, wherein the A block, B block, or both the A block and B block has one or more crosslinkable moieties.

11. A block copolymer having the following structure:

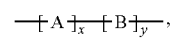

wherein the A block is a polystyrene block, polyhydroxystyrene block, a substituted analog thereof, or mixture thereof and the B block is a fluorinated block comprising at least one fluorinated monomer, and wherein x and y are each independently from 5 to 1000.

12. The block copolymer of claim 11, wherein the block copolymer further comprises one, two, or three additional blocks.

13. The block copolymer of claim 11, wherein the fluorinated monomer is a fluoromethacrylate monomer.

14. The block copolymer of claim 11, wherein the A block is a styrene block or a hydroxystyrene block, the fluorinated block comprises fluorinated alkyl methacrylate repeat units or a mixture of fluorinated alkyl methacrylate and alkyl methacrylate, and the fluorinated alkyl methacrylate block has from 5 to 1000 fluorinated alkyl methacrylate repeat units and from 0 to 950 alkyl methacrylate repeat units.

15. The block copolymer of claim 11, wherein the A block is poly(4-hydroxystyrene), poly(p-chloro styrene), poly(p-bromostyrene), poly(p-iodostyrene), or poly(p-chloromethylstyrene).

16. The block copolymer of claim 11, wherein the B block is a poly(fluromethacrylate) or poly(fluoromethacrylate-co-methacrylate).

17. The block copolymer of claim 16, wherein the B block is poly(2,2,2-trifluoroethylmethacrylate) or poly(2,2,2-trifluoroethyl methacrylate-co-methyl methacrylate).

18. The block copolymer of claim 11, wherein the A block, B block or both the A block and B block has one or more crosslinkable moieties.

19. The block copolymer of claim 11, wherein the block copolymer is poly(styrene-block-2,2,2-trifluoroethylmethacrylate, poly(t-butoxystyrene-block-2,2,2-trifluoroethylmethacrylate), poly(styrene-block-2,2,2-trifluoroethylmethacrylate-co-methylmethacrylate), or poly(hydroxystyrene-block-2,2,2-trifluoroethylmethacrylate).

20. A thin film comprising the block copolymer of claim 11.

* * * * *